(12) United States Patent
Andreev et al.

(10) Patent No.: US 7,548,844 B2
(45) Date of Patent: Jun. 16, 2009

(54) SEQUENTIAL TESTER FOR LONGEST PREFIX SEARCH ENGINES

(75) Inventors: Alexander E. Andreev, San Jose, CA (US); Anatoli A. Bolotov, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/706,943

(22) Filed: Feb. 13, 2007

(65) Prior Publication Data

US 2007/0276648 A1    Nov. 29, 2007

Related U.S. Application Data

(62) Division of application No. 10/387,988, filed on Mar. 13, 2003, now Pat. No. 7,200,785.

(51) Int. Cl.
*G06F 9/45* (2006.01)
(52) U.S. Cl. ............................................. 703/22; 703/6
(58) Field of Classification Search ..................... 703/3, 703/22
See application file for complete search history.

(56) References Cited

U.S. PATENT DOCUMENTS

| | | | | |
|---|---|---|---|---|
| 6,430,527 B1 * | 8/2002 | Waters et al. | ................... | 703/3 |
| 6,721,736 B1 * | 4/2004 | Krug et al. | ..................... | 707/5 |
| 6,829,606 B2 * | 12/2004 | Ripley | ........................... | 707/5 |
| 6,999,959 B1 * | 2/2006 | Lawrence et al. | .............. | 707/5 |
| 7,082,561 B2 * | 7/2006 | Andreev et al. | ............. | 714/733 |

\* cited by examiner

*Primary Examiner*—Paul L Rodriguez
*Assistant Examiner*—Andre Pierre Louis
(74) *Attorney, Agent, or Firm*—Suiter Swantz pc llo

(57) ABSTRACT

The present invention is directed to a sequential tester for longest prefix search engines. The tester may include a longest prefix search engine, an inputs generator for providing a nearly random flow of input commands to the longest prefix search engine and for outputting a floating rectangle which may represent a search table of the longest prefix search engine, a coding module for providing address and prefix information to the longest prefix search engine, a mapping module for providing data information to the longest prefix search engine, a super search engine for performing super search operations, and an analyzer for computing predicted outputs of the longest prefix search engine and for comparing the predicted outputs with actual outputs computed by the longest prefix search engine.

2 Claims, 1 Drawing Sheet

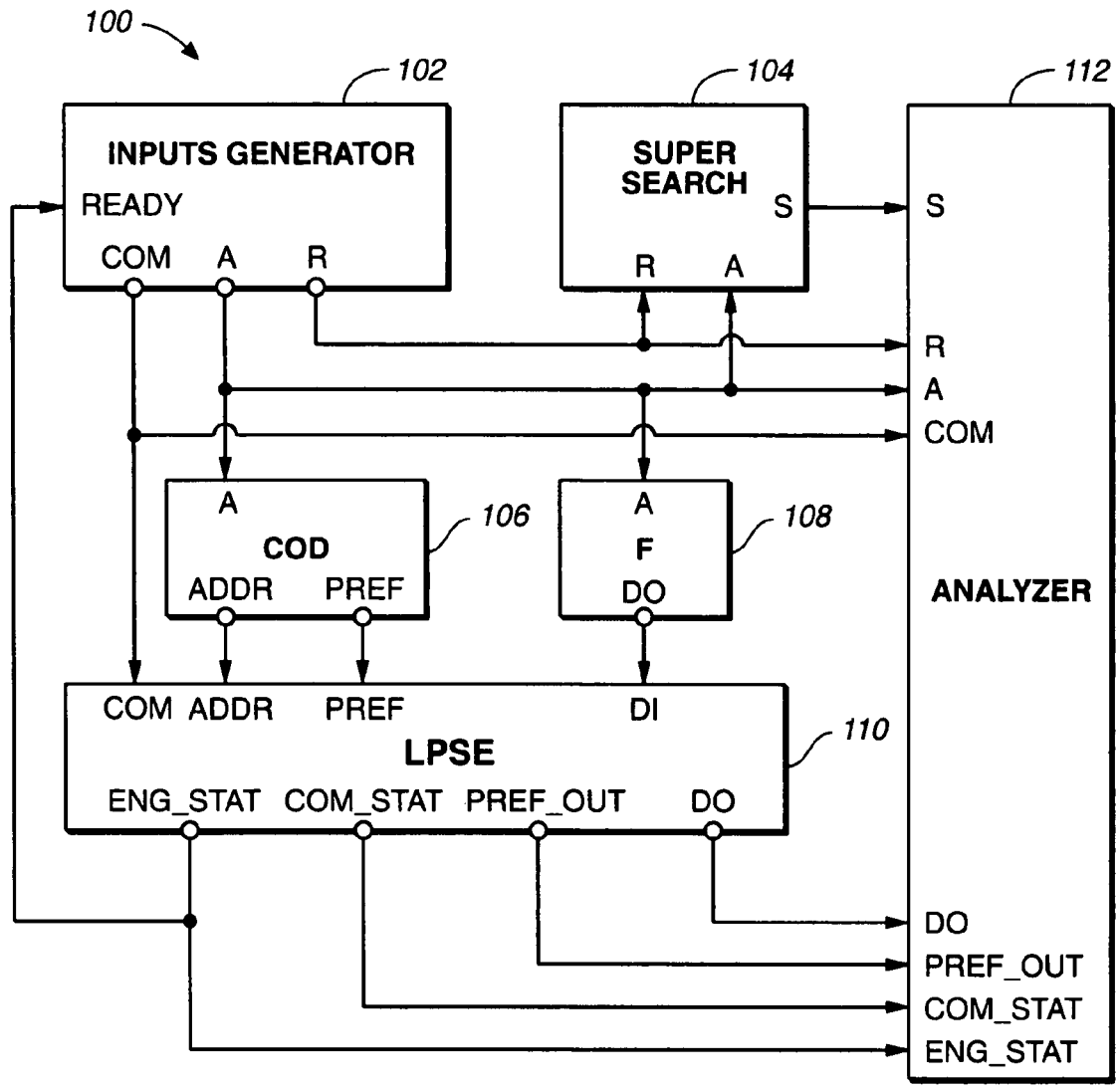
FIG._1
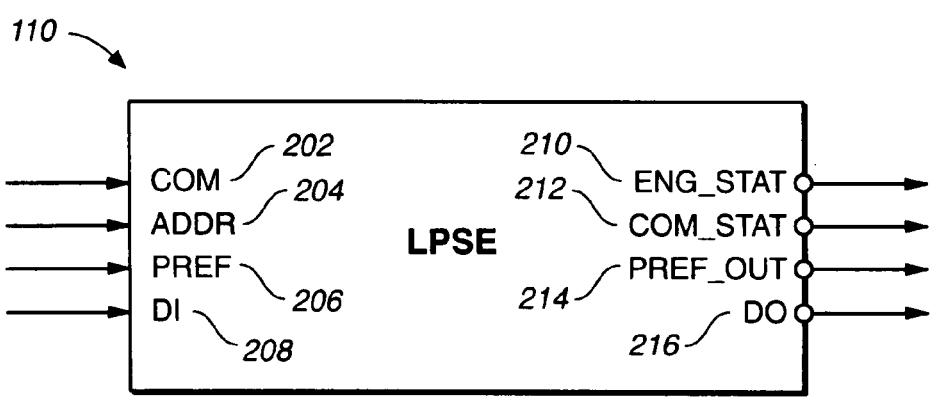
FIG._2

SEQUENTIAL TESTER FOR LONGEST PREFIX SEARCH ENGINES

CROSS-REFERENCE TO RELATED DOCUMENTS

The present application is a divisional application of U.S. patent application Ser. No. 10/387,988 filed on Mar. 13, 2003, now U.S. Pat. No. 7,200,785. The present application is also related to co-pending U.S. patent application Ser. No. 10/135,624, entitled "Built-in Functional Tester for Search Engines", filed Apr. 30, 2002, and to co-pending U.S. patent application Ser. No. 09/678,313, entitled "Fast Flexible Search Engine for Longest Prefix Match", filed Oct. 4, 2000. Said U.S. patent application Ser. Nos. 10/387,988, 10/135,624 and 09/678,313 are hereby incorporated by reference in their entireties.

FIELD OF THE INVENTION

The present invention generally relates to the field of search engines, and particularly to a sequential tester for longest prefix search engines.

BACKGROUND OF THE INVENTION

The complexity encountered in designing integrated circuits (ICs) increases greatly as the functional count of the IC increases. For example, in synthesis practice of very large scale integration (VLSI) designs, verification and testing problems play a major role in the final stages of development and designing. Special difficulty may lie in the testing of netlists and chips with complex sequential behavior, such as those found in search engines of different natures. For instance, data communications are most often accomplished by sending a group of data in a packet, together with the address of the location for which the data are intended. A search for data may be accomplished by conducting a binary search based on the address or prefix where the data are retained, or stored. The search may be conducted by a lookup procedure that matches the query address with the stored address. Therefore, a search engine that enables the search of the data needs to demonstrate such capabilities in a manner consistent with the contemplated usage of the search engine.

One of the practical methods to prove that search engines may function well in real chip practice is to perform their all-round verification by means of sequential testers that simulate actual usage of such search engines.

Longest prefix search engines (LPSEs) may be more difficult for simulation and testing than search engines for perfect match type, because for LPSEs one need simulate engine commands dealing with address prefixes of an arbitrary length rather than addresses of a fixed length. Moreover, LPSEs require particular encoding/decoding of engine internal memory, which may be significantly different from what is required for search engines for perfect match types.

Thus, it would be desirable to provide a sequential and functional tester which may be employed for simulating and testing LPSEs.

SUMMARY OF THE INVENTION

Accordingly, the present invention is directed to a sequential tester for LPSEs which may be employed for simulating and testing a LPSE. This tester may generate such inputs to a LPSE that outputs of the LPSE are easy to predict. The predicted outputs may then be compared with the actual outputs computed by the LPSE. Moreover, the inputs generated by the tester to the LPSE may look almost like arbitrary (nearly random) inputs, quite similar to those actual inputs which are applied to a LPSE in real chip practice.

In an exemplary aspect of the present invention, the tester may include a longest prefix search engine, an inputs generator for providing a nearly random flow of input commands to the longest prefix search engine and for outputting a floating rectangle which may represent a search table of the longest prefix search engine, a coding module for providing address and prefix information to the longest prefix search engine, a mapping module for providing data information to the longest prefix search engine, a super search engine for performing super search operations, and an analyzer for computing predicted outputs of the longest prefix search engine and for comparing the predicted outputs with actual outputs computed by the longest prefix search engine.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is an exemplary embodiment of a sequential tester for a longest prefix search engine in accordance with the present invention, wherein main modules of the sequential tester are shown; and FIG. 2 depicts an exemplary embodiment of the longest prefix search engine shown in FIG. 1 in accordance with the present invention.

DETAILED DESCRIPTION OF THE INVENTION

Reference will now be made in detail to the presently preferred embodiments of the invention, examples of which are illustrated in the accompanying drawings.

Referring generally now to FIGS. 1 and 2, exemplary embodiments of the present invention are shown. A purpose of the present invention is to create a sequential tester which may be used to simulate and analyze sequential behavior of LPSEs and to perform their functional testing.

In synthesis practice of VLSI designs the verification and testing problems play a major role at final stages of development and designing. Special difficulty may lie in the testing of netlists and chips with complex sequential behavior (functioning), such as those found in search engines of different natures (see, for instance, co-pending U.S. patent application Ser. No. 09/678,313).

One of the practical methods to prove that search engines may function well in real chip practice is to perform their all-round verification by means of sequential testers that simulate actual usage of such search engines.

LPSEs may be more difficult for simulation and testing than search engines for perfect match type, because for LPSEs one need simulate engine commands dealing with address prefixes of an arbitrary length rather than addresses of a fixed length. Moreover, LPSEs require particular encoding/decoding of engine internal memory, which may be significantly different from what was described in co-pending U.S.

patent application Ser. No. 10/135,624, which describes built-in testers for search engines for perfect match type.

An exemplary sequential and functional tester in accordance with the present invention may be employed for simulating and testing search engines with possibility of longest prefix searches. This tester may generate such inputs to a LPSE that outputs of the LPSE are easy to predict. The predicted outputs may then be compared with the actual outputs computed by the LPSE. Moreover, the inputs generated by the tester to the LPSE may look almost like arbitrary inputs, quite similar to those actual inputs which are applied to a LPSE in real chip practice.

The tester of the present invention may have the following features: (1) the tester may be a built-in feature of a LPSE; (2) the tester may work sequentially as a sequential finite machine; (3) the tester may test functions which are performed on a LPSE; (4) the tester may be of small size; (5) the tester may simulate almost all possible behavior of a LPSE; and (6) the user may set up a desirable flow of input commands and data to be tested.

It should be noted that a C/C++ model of the tester according to the present invention may also be used as an external tester or in co-modeling testing of LPSEs. For instance, the model may be used as part of co-modeling testing of search engines with IKOS V-Station or similar.

Referring to FIG. 1, an exemplary embodiment of a sequential tester 100 for LPSEs in accordance with the present invention is shown. The sequential tester 100 may include an Inputs Generator module 102, a Super Search module 104, a COD module (encoding module) 106, a F module (mapping module) 108, the LPSE module 110, and an Analyzer module 112.

FIG. 2 shows an exemplary embodiment of the LPSE 110 in accordance with the present invention. The LPSE 110 may have four input ports: a COM port 202 for inputting commands, an ADDR port 204 for inputting addresses, a PREF port 206 for inputting address prefixes, and a DI port 208 for inputting data. In addition, the LPSE 110 may have four output ports: an ENG_STAT port 210 for outputting the current engine status, a COM_STAT port 212 for outputting the current status of a command, a PREF_OUT port 214 for outputting the actual prefix length, and a DO port 216 for outputting actual data.

LPSE and its Functionality

The LPSE 110 is a functional module for searching and editing (inserting and deleting) entries. Each entry in a search engine may be in the form ((addr, pref), data_in), wherein (addr, pref) determines addr_pref that represents an address (address prefix) in Search Table, and data_in represents the data associated with the addr_pref. For a given address addr that arrives at the port ADDR 204, the parameter pref that arrives at the port PREF 206 may determine the length of the address prefix addr_pref, which may be stored with associated data data_in that arrives to the port DI 208 in engine Search Table. For example, for an entry with addr= (1001111010), the parameter pref=5=(0101) determines addr_pref=(10011), which is the first 5 bits of addr from its left side, and the parameter pref=3=(0011) determines addr_pref=(100), which is the first 3 bits of addr from its left side. Thus, in Search Table entries in the form (addr_pref, data) may be stored.

Input commands may include SEARCH, NEXT, INSERT and DELETE. INSERT and DELETE are editing commands, and SEARCH and NEXT are search commands. Commands arrive at the port COM 202.

LPSE commands may have latency equal to command_latency, which means completed commands may output in command_latency clock cycles after commands start.

The INSERT command may be performed only when the current engine status eng_stat (at the output port ENG_STAT 210) is "Ready to Insert or Delete" ("ready" state). When the current engine status is at a "ready" state, the LPSE 110 may search its Search Table for an entry at the address addr_pref. If such an entry (addr_pref, some_dat) is found, the LPSE 110 may first write the updated entry (addr_pref, data_in) into Search Table and then output com_stat "Already exist" at the port COM_STAT 212 and output data_out=some_dat at time (t+command_latency) at the port DO 216. If no entry is found in Search Table at the address addr_pref, the LPSE 110 may write into Search Table (if Search Table is not full at the moment) a new entry (addr_pref, data_in) and at time (t+command_latency) output com_stat "Insert successful" and data_out=data_in.

The DELETE command may be performed in a similar way to the INSERT command. If an entry (addr_pref, some_dat) already exists at the address addr_pref in Search Table, the LPSE 110 may first delete the entry from the memory and then output com_stat "Delete successful" and data_out=some_dat. Otherwise, com_stat may be set to "Entry not found" and data_out=0 at time (t+command_latency).

For both editing commands, the LPSE 110 may go to the next "Ready to Insert or Delete" status at a nondeterministic time.

The SEARCH command searches the engine memory for data written at the input address addr_pref and may be performed without regard to the current engine status. If an entry (addr_pref, some_dat) exists at the address address_pref in Search Table, then at time (t+command_latency) com_stat will be set to "Match is perfect" and data_out may output some_dat. If no entry exist at the given address prefix addr_pref, but instead an entry (shorter_addr_pref, some_other_dat) exists at the address shorter_addr_pref in memory, where shorter_addr_prefix is itself a prefix of the original addr_pref, then at time (t+command_latency) com_stat may be set to "Longest Prefix Math Match" and data_out may output some_other_dat associated with the longest possible shorter_addr_pref found in Search Table. Otherwise, if no entry with shorter address prefix exists in engine memory, com_stat may be set to "No Match" and data_out=0 at time (t+command_latency).

A NEXT command may be performed any number of times after SEARCH command. Each time a NEXT command may search for a shorter address prefix in the memory, output com_stat "Next Match found" and data_out equal to data associated with the shorter address prefix found, and also output the actual prefix length (at the output port PREF_OUT 214). In the case when no more shorter address prefix exist, the LPSE 110 may output com_stat "No Next Match" and data_out=0 at time (t+command_latency).

Search commands (SEARCH or NEXT) may be performed without regard to the current engine status of the LPSE 110.

When the engine status is "Ready to Insert or Delete" at the time t, the LPSE 110 may accept either search (SEARCH or NEXT) or edit (INSERT or DELETE) command at the same time t. In the case of either search command, the LPSE 110 may be again ready to accept a next search or INSERT or DELETE command in the next clock cycle. In the case of an accepted INSERT or DELETE command, the LPSE 110 may go to "Not Ready to Insert or Delete" ("busy" state) and may stay in the "busy" state for some time.

When the engine status is "Not Ready to Insert or Delete", then any arriving edit commands may be ignored.

The LPSE 110 may output (update) a (Ready or Not to Insert or Delete) bit of the engine status at next moment and an eng_stat bit (Memory Full or Not) after latency_delay moments of time. When the engine memory is full, INSERT command may be ignored.

An example of search engine implementation and more details about the construction and functionality may be found in co-pending U.S. patent application Ser. No. 09/678,313.

Generating Sequential Test

Examples of generating test trajectories may be provided below. Trajectories are generated by the tester 100. After decoding, the trajectories may look quite random from the standpoint of the LPSE 110, but may be easily analyzed, verified and tested from the standpoint of the tester 100 itself.

Encoding and Decoding of LPSE Address Space

One of the key tester constructions of the present invention is a torus Tor and encoding/decoding of the address space of the LPSE 110 by means of the torus and the points of the torus.

Let $n=2k-1$ be the address length for some integer k. Note in the case of an even address length, a dummy bit may be inserted in the middle of the address when performing encoding, and the dummy bit may be deleted when performing decoding. One may define $tor\_a = 2^k - 1$ and $tor\_b = 2^k + 1$ and consider further two sets of numbers $T\_a = \{0, 1, \ldots, tor\_a - 1\}$ and $T\_b = \{0, 1, \ldots, tor\_b - 1\}$, i.e. sets of residues by modulo tor_a and tor_b, respectively. Thus, the addition operation in T_a and T_b is performed by modulo tor_a and tor_b, respectively.

Note that k-bit representations of all numbers from T_a may be a table (which may also be denoted T_a) of all binary vectors of the length k, excluding vector of all ones $(1, \ldots 1)$. Thus, (k+1)-bit representations of all numbers from T_b may have the form (0,y), where y is an arbitrary k-bit vector, and in addition vector $(1,0, \ldots 0)$. This table may also be denoted T_b.

A torus Tor may be defined as $Tor = T\_a \times T\_b$. Taking into account table representations of the sets T_a and T_b, an arbitrary point A from Tor may be represented in binary form (x, cy), where x is any vector from T_a (i.e. arbitrary vector of the length k excluding $(1, \ldots 1)$), c is a bit, (i.e. 0 or 1), and if c=0, then y may be any k_bit vector and if c=1 then $y=(0, \ldots, 0)$. The point A may be associated with a 2 k-bit binary vector P as follows: if c=0, then P=(x,y), otherwise $P=(1, \ldots 1, x)$.

From these constructions it is clear that the torus points may correspond to all binary vectors of the length 2 k excluding vector $(1, \ldots, 1)$ and this correspondence is a one-to-one correspondence.

For a given vector P, one may, also in a one-to-one manner, extract addr_pref as the part to the left side of the last "zero" bit of the vector P. For example, if k=3, n=5, then for P=(101101) one may get addr_pref=1011 and pref=4, and for P=(010100) one may get addr_pref=01010 and pref=5. Note that addr_pref may be allowed to be empty, e.g., for P=(011111) pref=0 may be obtained.

For a given address and prefix length pref, in order to decode address one may first take address's pref bits (i.e. addr_pref), then add 0 and fill the rest bits with ones until a vector of 2 k-bit length may be obtained.

As shown in FIG. 1, the COD module 106 (or a DECOD module) may be used to compute transformation (or inverse transformation) from a point A to the address prefix addr_pref (or from addr_pref to a point A). Note that the DECOD module is not depicted in FIG. 1 but the DECOD module may be included in the Super Search module 104.

Search Table Representation

For LPSE Search Table representations, rectangular areas on torus Tor may be utilized, which may be quite similar to floating rectangles described in co-pending U.S. patent application Ser. No. 10/135,624. The main difference is in that here one may define $Tor = T\_a \times T\_b$ and thus the vector operation of additions with points from Tor is performed by modulo tor_a for their first coordinates and by modulo tor_b for the second coordinates.

A floating rectangle R is a rectangle grid of integers and may include two incomplete lines, such as the one adjusting to the left or to the top of the rectangle (for insertion of new points) and the other adjusting to the right or to the bottom of the rectangle (for deletion of existing points).

Insertion and deletion operations may be performed with the rectangle R. When an insertion operation is performed, a new point is added to the rectangle R, chosen from the insertion line. If a complete line is obtained after insertion, then the line may be added to the rectangle R. If there is no insertion line to start with, then one may first choose a new insertion line from two adjusting sides, such as the one from the top or the to the left of the rectangle R. Actual choice may be determined by a random bit.

When a deletion operation is performed, a point may be deleted from a deletion line. If a deletion line is not available, a new deletion line may be chosen from two adjusting sides, such as the one from the right side or the other from the bottom of the rectangle R. Again, the actual choice may be determined by a random bit.

Besides the foregoing described insertion and deletion operations, search operations may also be performed such that for a given point a decision whether this point is or is not from the rectangle R may be made. This may be easily computed when knowing corner points of the rectangular R. Note that this operation does not change the rectangle R.

Finally, super search operations need also be performed in order to be ready to perform a command NEXT that may arrive after a SEARCH command. For a given point P, let addr_pref and pref denotes what one may get after encoding the point P. Now one may determine up to (addr_length+1) points P_0, P_1, ... P_pref (P_pref coincide with P), and for each of these points one may perform search operations and then save and hold the results in a binary vector S (see FIG. 1). This multiple search may be defined as a super search operation. The first pref bits of S (the rest are equal to 0) may indicate whether the point P_i belongs to the rectangular or not, i=0, ..., pref. Point P_i may be determined as a prefix of the length i of addr_pref computed for P. For example, if P=(101001), then addr_pref=1010 for pref=4 and one may get P_0=(011111), P_1=(101111), P_2=(100111), P_3=(101011) and finally P_4=P (101001).

Super search operations may be performed by the Super Search module 104 (see FIG. 1), which may allow the tester 100 to simulate and compute LPSE outputs in the case of command NEXT.

According to an exemplary embodiment of the present invention, the work flow of the tester 100 may be arranged in such a way that a flow of input data and primary commands generated for the floating rectangular R after applying encoding procedures becomes a nearly random flow of inputs and commands to the LPSE 110. Moreover, since LPSE Search Table always corresponds to the current floating rectangular, Search Table may be easily available for analysis and comparison during the testing.

Random Flow of Primary Commands

Using an appropriate random bit generator, primary commands such as com_search, com_search_inside, com_insert, com_insert_inside, com_delete, com_delete_outside, com_next, and the like may be generated (preferably one at a time) at the discrete moments of time t=0, 1, ... according to a preset distribution of probability. These primary commands may be used to test sequential and functional behavior of the LPSE 110.

A point A (see FIG. 1) from the torus Tor may be associated with each of these commands. For the command com_search, A may be chosen as a random point from Tor; for the commands com_search_inside and com_insert_inside, A may be chosen as a random point from the current rectangle; for the command com_delete_outside, A may be chosen as a random point from outside of the current rectangle. The command com_next may be associated with the point of last command SEARCH. Note that these commands do not change the floating rectangle.

For command com_insert, an insertion operation may be applied to the current rectangle R, and thus a point A may be inserted to the rectangle R. This point A may be associated with the given command com_insert.

In the case of command com_delete, a deletion operation may be applied to the current rectangle R, and thus a point A may be deleted from the rectangle R.

With an insertion or deletion operation being performed, a new rectangle R_new may be obtained at the same moment. Note that actual switching from the rectangle R to the rectangle R_new may actually depend on the auxiliary flag "Ready". If Ready=0, the old rectangle R may be left there without any change at the next moment of time. If Ready=1, then at the next moment of time R_new may become the current rectangle. Flag "Ready" may be computed each moment from the engine status output (eng_stat) of the LPSE 110. That is, if eng_stat is "Ready to Insert or Delete", then Ready=1, and if eng_stat is "Not Ready to Insert or Delete", then Ready=0 (see FIG. 1).

The number of points in the rectangle may be denoted as a count. If a count reaches a maximal value equal to engine_capacity, the probability distribution for primary commands may be automatically changed to force the rectangle to move to an empty state (i.e. count=0). When the rectangle becomes empty, the probability distribution may again be changed in order to force the rectangle to move to a full state (i.e., count=engine_capacity). It should be noted that a more complex scenario may be preset by establishing rules for probability changes and for managing the flow of primary commands, as may be contemplated by an person of ordinary skill in the art.

It is noteworthy that when count=0 or count=engine_capacity, flow of primary commands may be slightly modified. For example, when count=engine_capacity, in order to avoid error a command com_insert generated may be changed to a command com_insert_inside. Similarly, when count=0, a command com_delete generated may be changed to a command com_delete_outside. Associated points may be changed correspondingly.

LPSE Input Command and Data

Primary commands generated by an appropriate random bit generator may be re-denoted into LPSE commands in the module Inputs Generator 102 of the tester 100 (see FIG. 1). For example, commands com_search and com_search_inside may become a simple LPSE command SEARCH; com_insert and com_insert_inside may become a LPSE command INSERT; com_delete and com_delete_outside may become a LPSE command DELETE; command com_next may become LPSE command NEXT.

To compute the address and prefix length, the foregoing described encoding procedure that embeds torus points into the address space of LPSE may be used. Where A is a current point associated with a LPSE command, addr_pref and pref may be computed by means of the module COD 106 of the tester 100 (see FIG. 1).

Input_data for the input DI of the LPSE 110 (see FIG. 1) may be computed by the mapping module F 108 that embeds a torus point into the input data space. It may be a deterministic mapping. It is appreciated that a non-zero input_data is needed only in the case of a LPSE command INSERT.

Background Computation and Comparison

By knowing a few parameters that describe the current floating rectangle R and by knowing input commands and input data, the LPSE behavior may be easily simulated, and LPSE outputs except the engine status may be correctly computed and predicted. Although the moment when the LPSE status changes from "busy" state to "ready" state may not be predicted with the present invention, this is nonessential for testing because the LPSE status change is used only to switch from the current rectangle to the new one when an arrived editing command is accepted by the LPSE.

All these foregoing described computations on torus may be preformed as a background computation, which may be performed in the module Analyzer 112 of the tester 100, which may be communicatively coupled to the inputs generator 102, the super search 104, and the LPSE 110 (see FIG. 1), to predict the outputs of the LPSE. The predicted LPSE outputs computed by the module Analyzer 112 and the actual LPSE outputs computed by the LPSE 110 may then be compared during the test. This comparison may also be performed in the Analyzer 112.

It is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for simulating and testing sequential behavior of a longest prefix search engine, comprising:

supplying a nearly random flow of input commands to a longest prefix search engine;

encoding an address space of said longest prefix search engine using a torus and points of said torus;

generating said points which are associated with said input commands;

generating a floating rectangle on said torus, said floating rectangle representing a search table of said longest prefix search engine;

supplying address, prefix, and data information extracted from said points to said longest prefix search engine as inputs;

computing actual outputs of said longest prefix search engine;

computing predicted outputs of said longest prefix search engine; and comparing said actual outputs and said predicted outputs.

2. An apparatus for simulating and testing sequential behavior of a longest prefix search engine, comprising:

means for supplying a random flow of input commands to a longest prefix search engine;

means for encoding an address space of said longest prefix search engine using a torus and points of said torus;

means for generating said points which are associated with said input commands;

means for generating a floating rectangle on said torus, said floating rectangle representing a search table of said longest prefix search engine;

means for supplying address, prefix, and data information extracted from said points to said longest prefix search engine as inputs; and means for computing actual outputs of said longest prefix search engine;

means for computing predicted outputs of said longest prefix search engine; and means for comparing said actual outputs and said predicted outputs.

\* \* \* \* \*